(12) United States Patent
Blankenship

(10) Patent No.: US 6,970,033 B1
(45) Date of Patent: Nov. 29, 2005

(54) TWO-BY-TWO MULTIPLEXER CIRCUIT FOR COLUMN DRIVER

(75) Inventor: Timothy L. Blankenship, Austin, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 30 days.

(21) Appl. No.: 10/723,280

(22) Filed: Nov. 26, 2003

(51) Int. Cl.[7] .............................................. H03K 17/00
(52) U.S. Cl. ....................................... 327/408; 327/99
(58) Field of Search .......................... 327/99, 407–411, 327/201, 202, 215

(56) References Cited

U.S. PATENT DOCUMENTS

| | | | |
|---|---|---|---|
| 5,281,865 A | * | 1/1994 | Yamashita et al. .......... 327/208 |
| 5,604,449 A | | 2/1997 | Erhart et al. |
| 5,754,156 A | | 5/1998 | Erhart et al. |
| 6,040,815 A | | 3/2000 | Erhart et al. |

* cited by examiner

Primary Examiner—Kenneth B. Wells
(74) Attorney, Agent, or Firm—Darby & Darby P.C.; Matthew M. Gaffney

(57) ABSTRACT

A two-input, two-output multiplexer circuit has two tri-state inverter circuits and two switch circuits. The multiplexer outputs may be interchanged depending on a control signal. Each tri-state inverter circuit is configured to receive one of the inputs, invert it, and provide the corresponding inverted signal at the corresponding multiplexer output when the control signal corresponds to a first logic level. If the control signal corresponds to a second logic level: each switch circuit is configured to turn on, and each tri-state inverter circuit is configured to provide a high-impedance output. The first switch circuit is configured to couple the first inverted signal to the second multiplexer output when the first switch circuit is on. Similarly, the second switch circuit is configured to couple the second inverted signal to the first multiplexer output when the second switch circuit is on.

21 Claims, 8 Drawing Sheets

TWO-BY-TWO MULTIPLEXER CIRCUIT FOR COLUMN DRIVER

FIELD OF THE INVENTION

The invention is related to multiplexers. In particular, the invention is related to a two-input, two-output multiplexer circuit for use in a column driver.

BACKGROUND OF THE INVENTION

Liquid Crystal Displays (LCDs) are used in a variety of products, including hand-held games, hand-held computers, and laptop/notebook computers. These displays are available in both gray-scale (monochrome) and color forms, and are typically arranged as a matrix of intersecting rows and columns. The intersection of each row and column forms a pixel, or dot, the density and/or color of which can be varied in accordance with the voltage applied to the pixel in order to define the gray shades of the liquid crystal display. These various voltages produce the different shades of color on the display, and are normally referred to as "shades of gray" even when speaking of a color display.

The image displayed on the screen may be controlled by individually selecting one row of the display at a time, and applying control voltages to each column of the selected row. The period during which each such row is selected may be referred to as a "row drive period". This process is carried out for each individual row of the screen; for example, if there are 480 rows in the array, then there are typically 480 row drive periods in one display cycle. After the completion of one display cycle during which each row in the array has been selected, a new display cycle begins, and the process is repeated to refresh and/or update the displayed image. Each pixel of the display is periodically refreshed or updated many times each second, both to refresh the voltage stored at the pixel as well as to reflect any changes in the shade to be displayed by such pixel over time.

LCDs used in computer screens require a relatively large number of such column driver outputs. Color displays typically require three times as many column drivers as conventional "monochrome" LCD displays; such color displays usually require three columns per pixel, one for each of the three primary colors to be displayed.

The column driver circuitry is typically formed upon monolithic integrated circuits. Integrated circuits which serve as column drivers for active matrix LCD displays generate different output voltages to define the various "gray shades" on a liquid crystal display. These varying analog output voltages vary the shade of the color that is displayed at a particular point, or pixel, on the display. The column driver integrated circuit must drive the analog voltages onto the columns of the display matrix in the correct timing sequence.

LCDs are able to display images because the optical transmission characteristics of liquid crystal material change in accordance with the magnitude of the applied voltage. However, the application of a steady DC voltage to a liquid crystal will, over time, permanently change and degrade its physical properties. For this reason, it is common to drive LCDs using drive techniques which charge each liquid crystal with voltages of alternating polarities relative to a common midpoint voltage value. It should be noted that, in this context, the "voltages of alternating polarities" does not necessarily require the use of driving voltages that are greater than, and less than, ground potential, but simply voltages which are above and below a predetermined median display bias voltage. The application of alternating polarity voltages to the pixels of the display is generally known as inversion.

Accordingly, driving a pixel of liquid crystal material to a particular gray shade involves two voltage pulses of equal magnitude but opposite polarity relative to the median display bias voltage. The driving voltage applied to any given pixel during its row drive period of one display cycle is typically reversed in polarity during its row drive period on the next succeeding display cycle. The pixel responds to the RMS value of the voltage so the final "brightness" of the pixel only depends on the magnitude of the voltage and not the polarity. The alternating polarity is used to prevent "polarization" of the LC material due to impurities.

BRIEF DESCRIPTION OF THE DRAWINGS

Non-limiting and non-exhaustive embodiments of the present invention are described with reference to the following drawings, in which.

DETAILED DESCRIPTION

Figure 1:
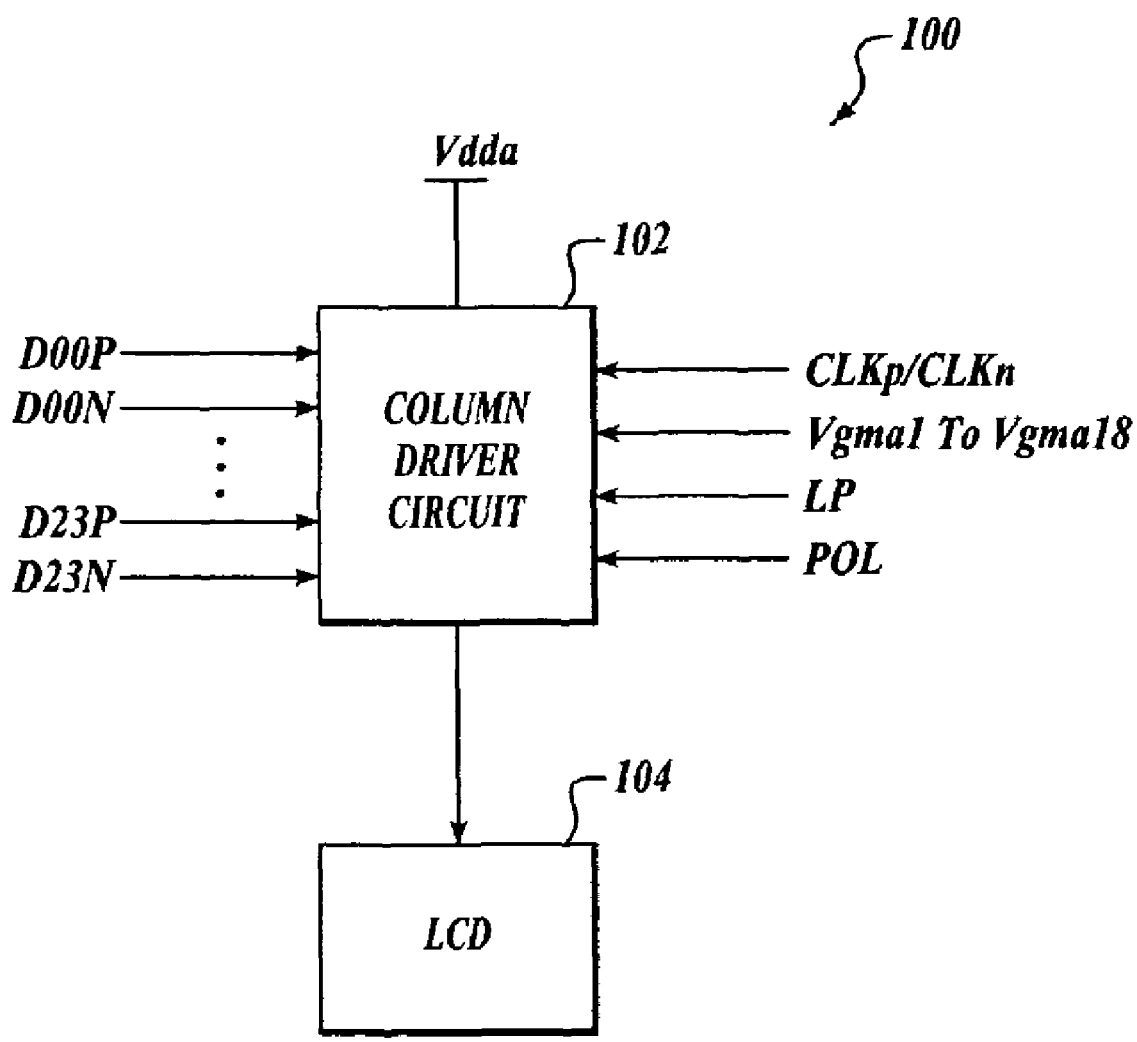
FIG. 1 illustrates a block diagram of a column driver circuit for driving an LCD.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a multiplexer circuit. An example embodiment of a two-input, two-output multiplexer circuit has two tri-state inverter circuits and two switch circuits. The multiplexer outputs may be interchanged depending on a control signal. Each tri-state inverter circuit is configured to receive one of the inputs, invert it, and provide the corresponding inverted signal at the corresponding multiplexer output if the control signal corresponds to a first logic level. If the control signal corresponds to a second logic level: each switch circuit is configured to turn on, and each tri-state inverter circuit is configured to provide a high-impedance output. The first switch circuit is configured to couple the first inverted signal to the second multiplexer output if the first switch circuit is on. Similarly, the second switch circuit is configured to couple the second inverted signal to the first multiplexer output if the second switch circuit is on.

FIG. 1 illustrates an example embodiment of a circuit (100) for an LCD. Circuit 100 includes a column driver circuit (102) and an LCD (104). One example column driver circuit 102 is a high-voltage column driver suitable for use in notebook LCD displays, desktop LCD monitors, LCD TV displays, and other applications.

Column driver circuit 102 is configured to drive LCD 104. As an example, column driver circuit 102 includes either a 6-bit or a 8-bit architecture, 384–480 outputs, and a 10V–16V power supply (Vdda). Other embodiments of column driver circuit 102 may include other architectures.

In operation, column driver circuit 102 is configured to receive: (1) a polarity signal (pol), (2) a latch pulse signal (LP), (3) a data clock signal (CLKp/CLKn), (4) gamma reference voltages (vgma 1–vgma l8), and (5) data inputs (D00p/n–D23p/n). Column driver circuit 102 is responsive to signal pol to switch the polarity or voltage range of the column driver output. There are two polarity ranges, high range (e.g. from Vdda/2 to Vdda), and low range (e.g. from gnd to Vdda/2), wherein Vdda corresponds to a power supply voltage, and gnd is associated with a ground terminal.

Figure 2:
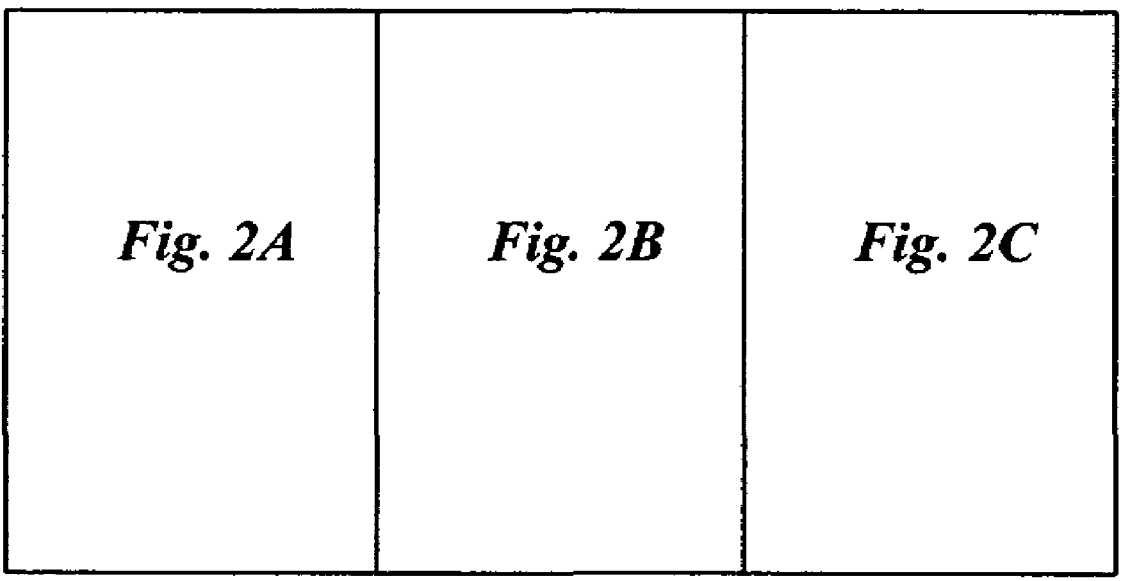
FIG. 2 illustrates a block diagram of a column driver circuit.
Figure 2A:
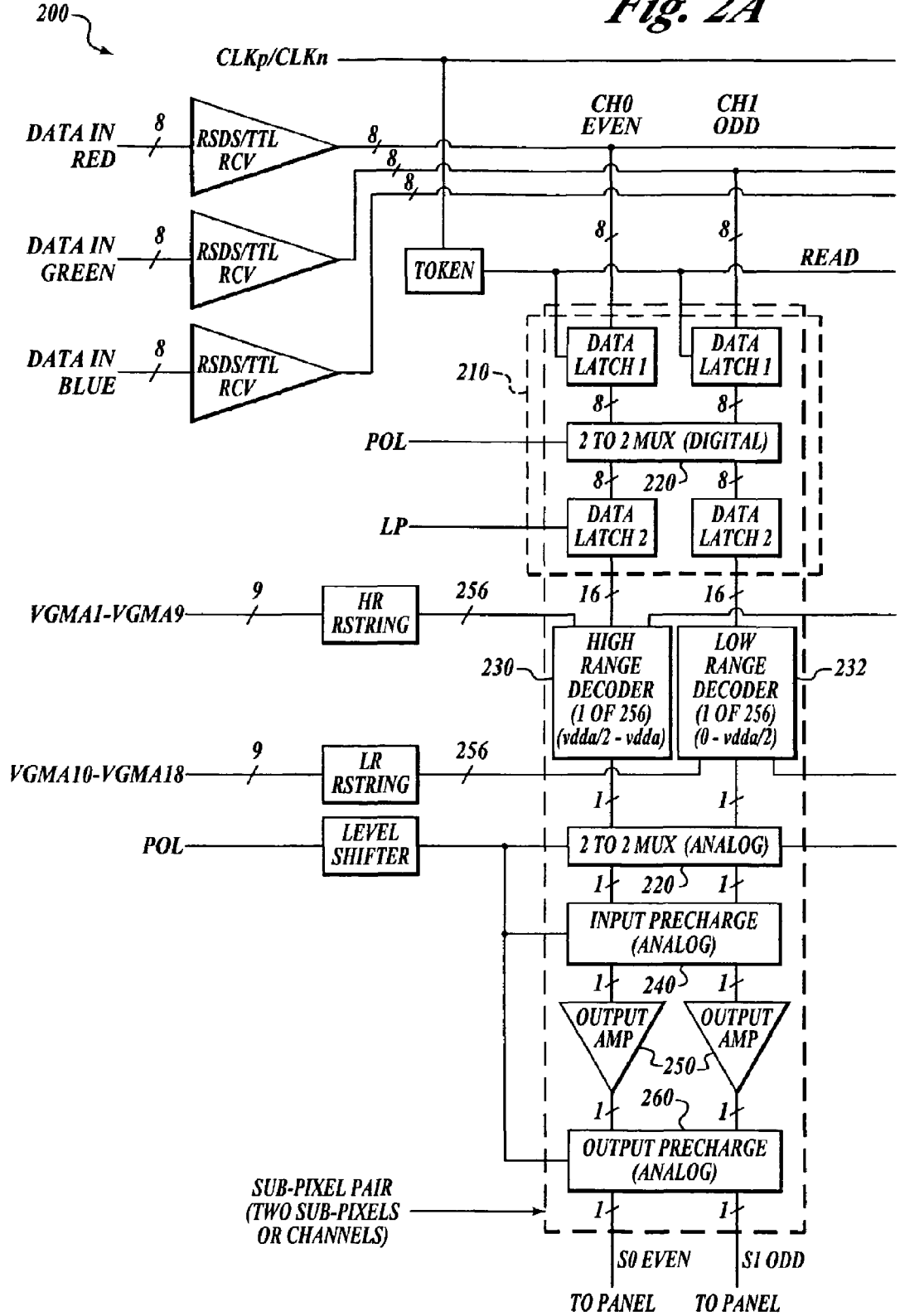
Figure 2B:
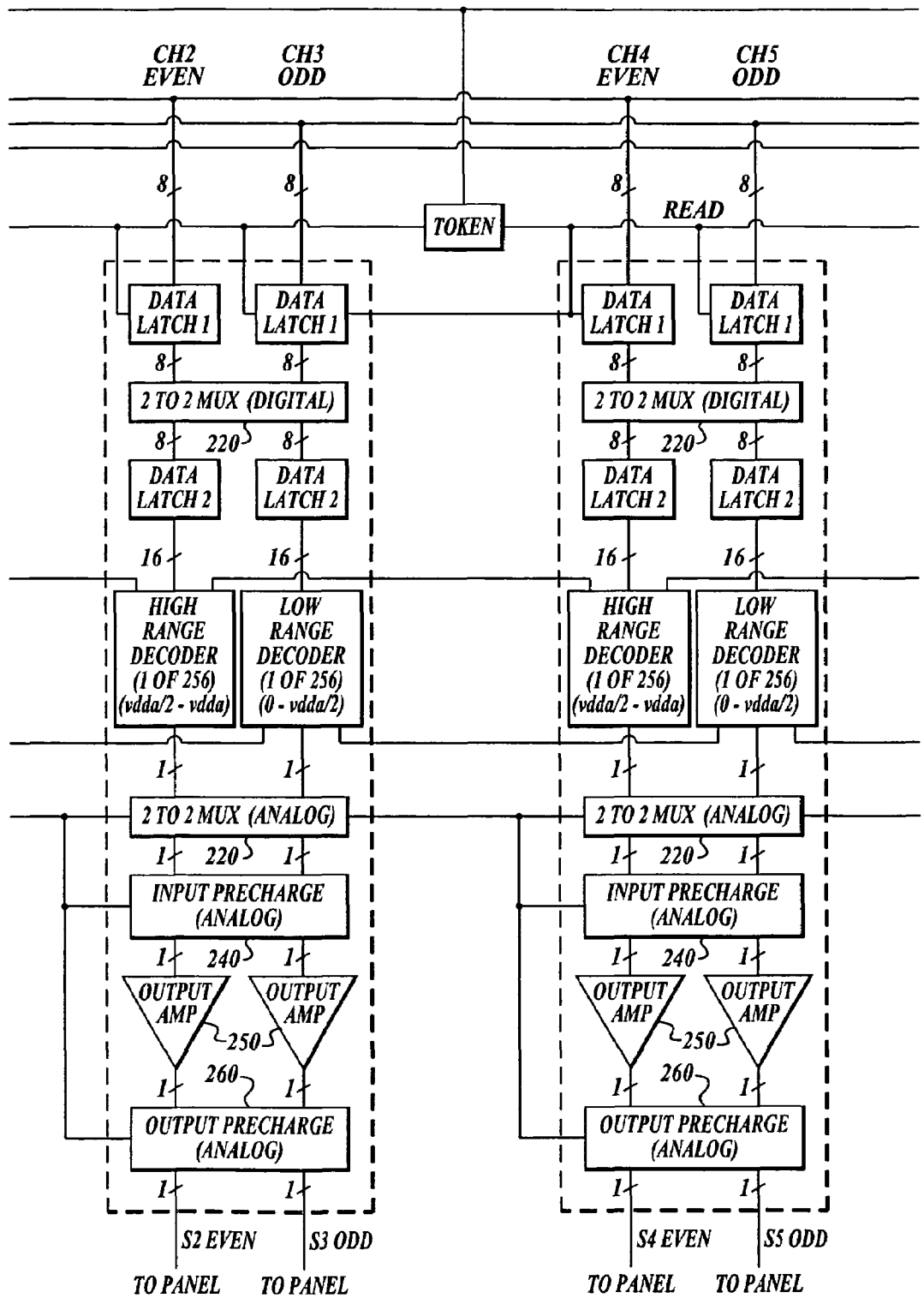
Figure 2C:
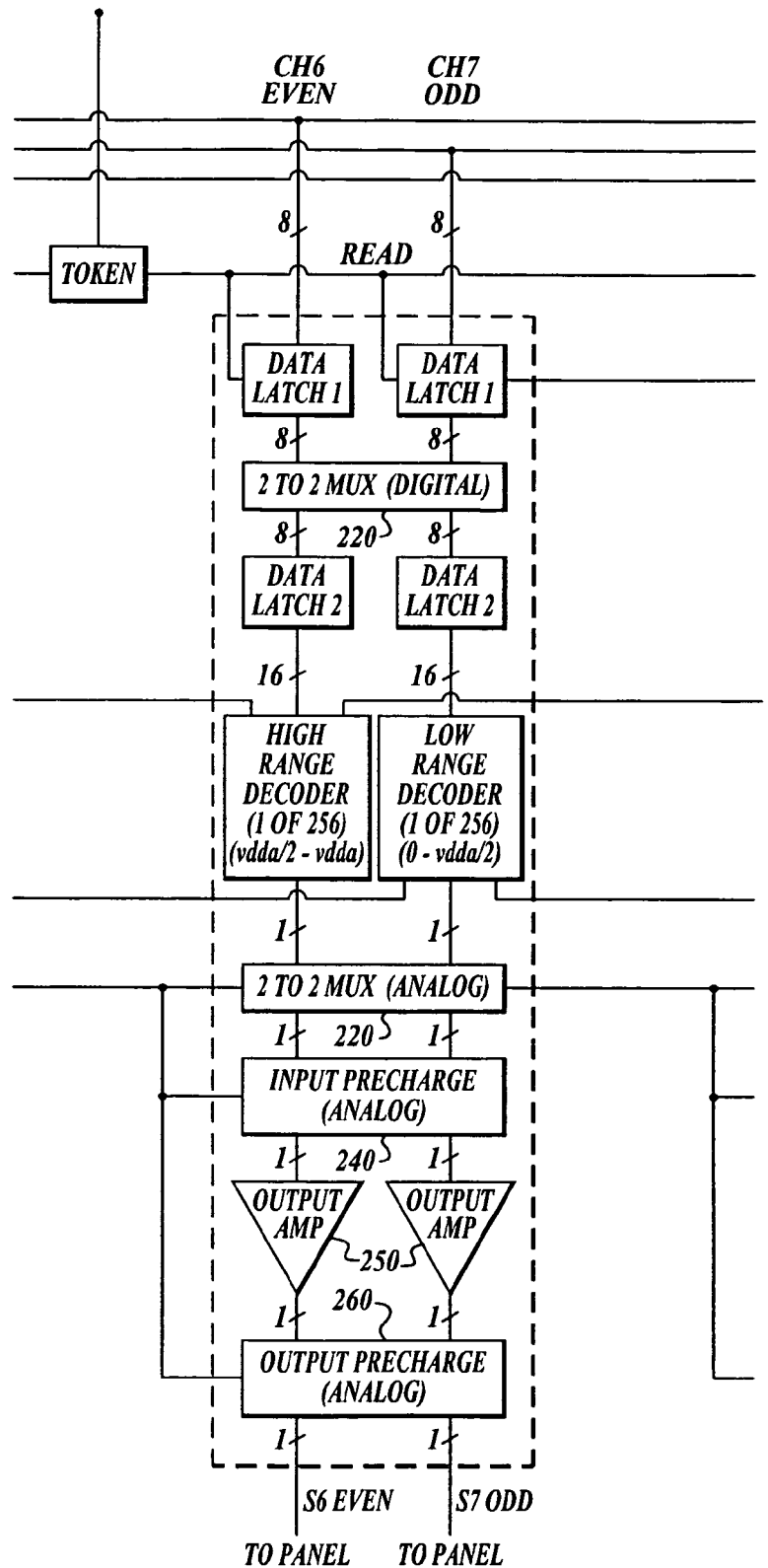

FIG. 2 illustrates an example embodiment of a column driver circuit (200) that is arranged in accordance with aspects of the present invention. Column driver circuit 200 comprises a plurality of channels (e.g. sub-pixels) that are organized in pairs.

Each pair includes portion 210, a high-range decoder circuit (230), a low-range decoder circuit (232), a second multiplexer circuit (220), an input precharge circuit (240), two output amplifier circuits (250), and an output precharge circuit (260). Portion 210 includes a first multiplexer circuit (220).

High-range decoder circuit 230 is coupled between a first decoder node and a third multiplexer input node. Low-range decoder circuit 232 is coupled between a second decoder node and a fourth multiplexer input node. The second multiplexer circuit is coupled to the third multiplexer input node, the fourth multiplexer input node, a third multiplexer output node, and a fourth multiplexer output node.

Column driver circuit 200 is suitable for use with, for example, dot inversion and column inversion drive schemes. If a dot inversion drive scheme is implemented, each channel is in an opposite phase (inverted) from its adjacent channels. The output of column driver circuit 200 is such that, all even numbered outputs are in one voltage range (low/high), while all odd numbered outputs are in the opposite voltage range (high/low). Furthermore, the dot-inversion scheme does not allow any two adjacent sub-pixels to be in the same (low or high) range at the same time. Each pair comprises a high-range decoder (230) in one channel of each pair and a low-range decoder (232) in the other channel of each pair. The first multiplexer circuit (220) is a digital multiplexer circuit that swaps data between the two channels in the pair. The second multiplexer circuit (220) is an analog multiplexer circuit that swaps analog voltages between the two channels in the pair. The swapping is controlled by a polarity signal (pol). The logic level associated with signal pol indicates whether an output should be in the high range or low range.

Each even channel includes a high-range decoder (230), and each odd channel includes a low-range decoder (232). If signal pol corresponds to a first logic level, multiplexer circuit 100 will cause the even data to remain in the even channel for decoding by the high-range decoder, and the odd data to remain in the odd channel for decoding by the low-range decoder (i.e., the data is not swapped). If the polarity signal corresponds to a second logic level, the multiplexer circuit will cause the odd data to go to the even channel for high-range decoding, and to cause the even data to go to the odd channel for low-range decoding (i.e., the data is swapped). The second multiplexer circuit (220) is configured to swap the analog voltages if the data was swapped by the first multiplexer circuit, so that the data will go to the correct channels.

Figure 3:
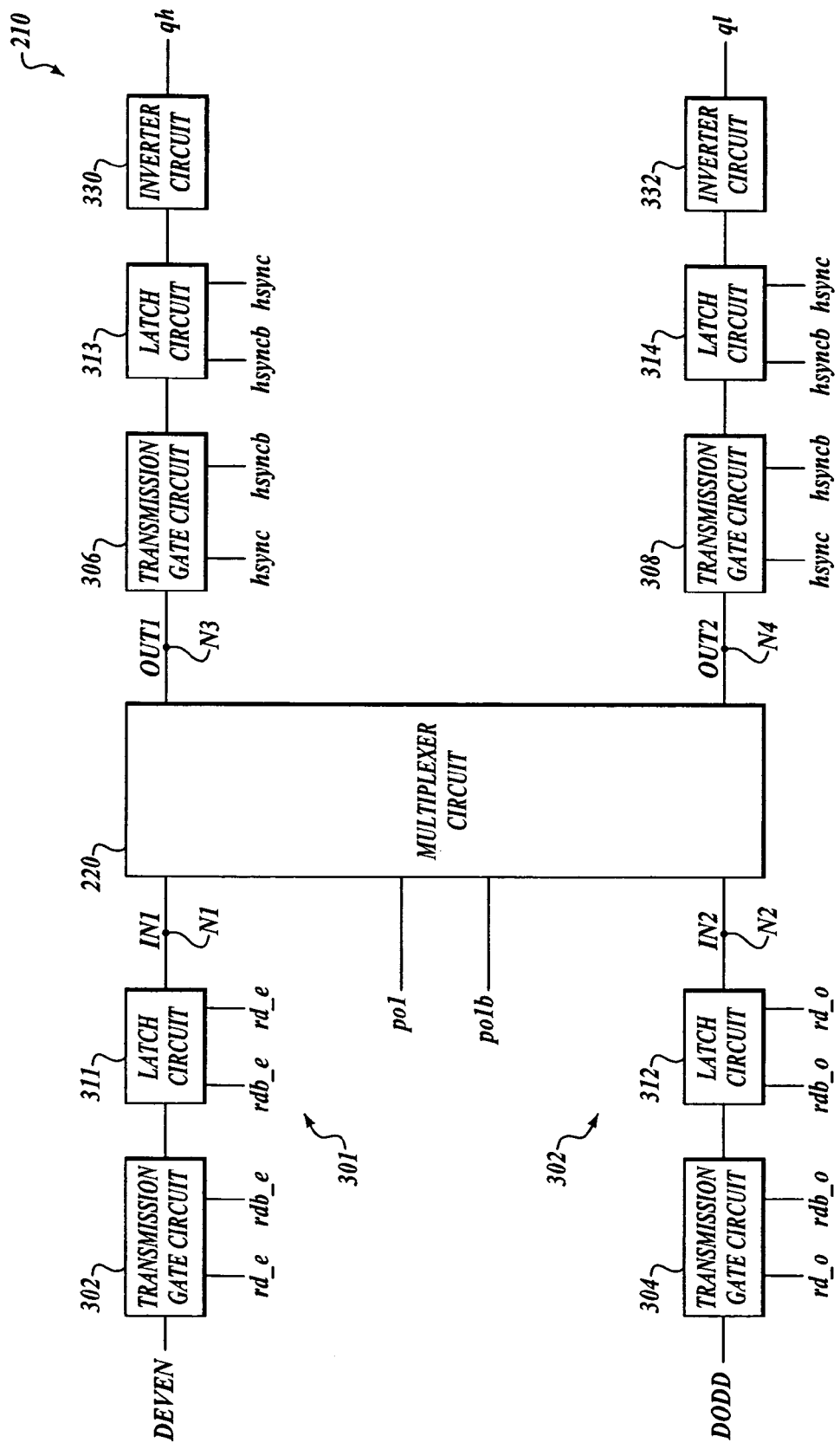
FIG. 3 illustrates a block diagram of a portion of a pair of channels of FIG. 2.

FIG. 3 illustrates an example embodiment of a portion (210) of a pair of channels of FIG. 2. Portion 210 comprises transmission gate circuits (302, 304, 306, and 308), latch circuits (311–314), a multiplexer circuit (220), and inverter circuits (330 and 332).

Portion 210 includes a portion of an even channel (301) and a portion of an odd channel (302). The even channel (301) is connected as follows. The first transmission gate circuit (302) is coupled between a first channel input node and a first latch node. The first latch circuit (311) is coupled between the first latch node and the first multiplexer input node. Multiplexer circuit 220 is coupled to the first multiplexer input node (N1), the second multiplexer input node (N2), the first multiplexer output node (N3), and the second multiplexer output node (N4). The second transmission gate circuit (306) is coupled between the first multiplexer output node and a second latch node. The second latch circuit (313) is coupled between the second latch node and a first inverter node. The first inverter circuit (330) is coupled between the first inverter node and a first decoder node. The odd channel (302) is connected in a substantially similar manner as the even channel.

Latches 311 and 312 are configured to operate as input latches for multiplexer circuit 220, and latches 313 and 314 are configured to operate as output latches for multiplexer circuit 220. Latches 311 and 312 are configured to operate at the pixel clock frequency (CLKp/CLKn) (e.g. 60–100 MHz). The horizontal synchronization signal (hsync) controls latches 313 and 314. Signal hsync operates at the horizontal line rate (e.g. 70 KHz–100 KHz).

Exemplary transmission gate circuit 302 is responsive to an even data signal (deven), an even read signal (rd_e), and a complement of the even read signal (rdb_e). Transmission gate circuit 302 is arranged to couple signal deven to latch circuit 311 if signal rd_e corresponds to an active level. Transmission gate circuit 306 is configured to couple a first multiplexer output signal (out1) from node N3 to latch circuit 313 if signal hsync corresponds to the active logic level. Inverter circuit 330 is configured to invert an output of latch circuit 313 to provide a first portion output signal (qh). The odd channel (302) operates in a substantially similar manner to the even channel (301).

Figure 4:
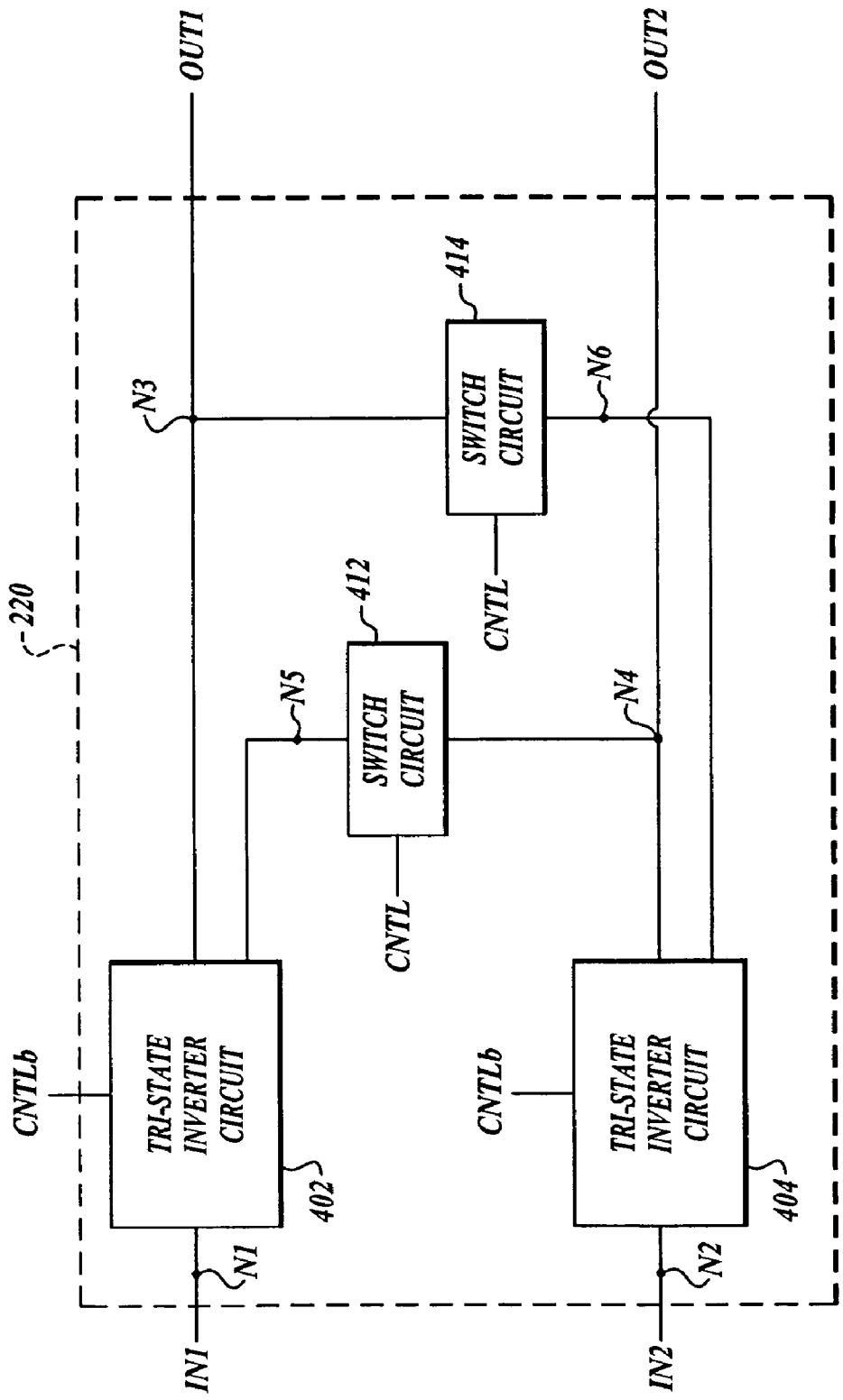
FIG. 4 illustrates a block diagram of a multiplexer circuit.

FIG. 4 is an exemplary embodiment of a multiplexer circuit (220) that includes a first tri-state inverter circuit (402), a second tri-state inverter circuit (404), a first switch circuit (412), and a second switch circuit (414). The first tri-state inverter circuit (402) is coupled to a first multiplexer input node (N1), a first multiplexer output node (N3), and a first switch node (N5). The second tri-state inverter circuit (404) is coupled to a second multiplexer input node (N2), a second multiplexer input node (N4), and a second switch node (N6). The first switch circuit (412) is coupled between the first switch node (N5) and the second multiplexer input node (N4). The second switch circuit (414) is coupled between the second switch node (N6) and the first multiplexer output node (N3).

The first tri-state inverter circuit (402) is configured to provide an inverter output signal at the first multiplexer output node (N3) in response to a first multiplexer input signal (in1) if the control signal (cnt1) corresponds to a first logic level (e.g. logic 0). The first tri-state inverter circuit (402) is also configured to isolate the first multiplexer input node (N1) from the first multiplexer output node (N3) if a control signal (cnt1) corresponds to a second logic level (e.g. logic 1). The first tri-state inverter circuit (402) is also configured to provide the inverter output signal at the first switch node (N5) in response to the first multiplexer input signal, even if the control signal (cnt1) corresponds to the second logic level.

The second tri-state inverter circuit (404) is configured to isolate the second multiplexer input node (N2) from the second multiplexer input node (N4) if the control signal (cnt1) corresponds to the second logic level.

The first switch circuit (412) is configured to short the first switch node (N5) to the second multiplexer output node (N4) if the control signal (cnt1) corresponds to the second logic level, and isolate the first switch node (N5) from the second multiplexer output node (N4) if the control signal (cnt1) corresponds to the first logic level. The first switch circuit (412) is arranged to couple the first inverter signal from the first switch node (N5) to the second multiplexer input node (N4) if the control signal (cnt1) corresponds to the second logic level. The second switch circuit (414) is configured to short the second switch node (N6) to the first multiplexer output node (N3) if the control signal (cnt1) corresponds to the second logic level, and isolate the second switch node (N6) from the first multiplexer output node (N3) if the control signal (cnt1) corresponds to the first logic level. The second switch circuit (414) is arranged to couple the second inverter signal from the second switch node (N6) to the first multiplexer output node (N3) if the control signal (cnt1) corresponds to the second logic level.

An exemplary embodiment of multiplexer circuit 220 is configured to use complementary signals, and this exemplary embodiment is configured to operate as follows.

The first tri-state inverter circuit (402) is configured to receive a first multiplexer input signal (in1) at the first multiplexer input node (N1). The first tri-state inverter circuit (402) is also configured to receive a first control signal (cnt1) and a complement of the first control signal (cnt1b). The first tri-state inverter circuit (402) is also configured provide a first inverter output signal at the first switch node (N5) and a fifth switch node (N7) in response to the first multiplexer input signal, and provide the first inverter signal at the first inverter output node in response to the first multiplexer input signal (in 1) if the first control signal (cnt1) corresponds to a first logic level.

The second tri-state inverter circuit (404) is configured to receive a second multiplexer input signal (in2) at the second multiplexer input node (N2). The second tri-state inverter circuit (404) is also configured to receive the first control signal (cnt1) and to receive the complement of the first control signal (cnt1b). The second tri-state inverter circuit (404) is also configured to provide a second inverter output signal at the second switch node (N6) and a sixth switch node (N8) in response to the second multiplexer input signal (in2), and provide the second inverter signal at the second inverter output node in response to the second multiplexer input signal if the second control signal (cnt1) corresponds to the first logic level.

The first switch circuit (412) is further coupled to the fifth switch node (N7). The first switch circuit (412) is configured to receive the first control signal (cnt1) and the complement of the first control signal (cnt1b), and provide the first inverter signal at the second multiplexer input node (N4) if the first control signal (cnt1) corresponds to the second logic level. The second switch circuit (414) is further coupled to the sixth switch node (N8). The second switch circuit (414) is configured to receive the first control signal (cnt1) and the complement of the first control signal (cnt1), and to provide the second inverter signal at the first multiplexer output node (N3) if the first control signal (cnt1) corresponds to the second logic level.

Figure 5:
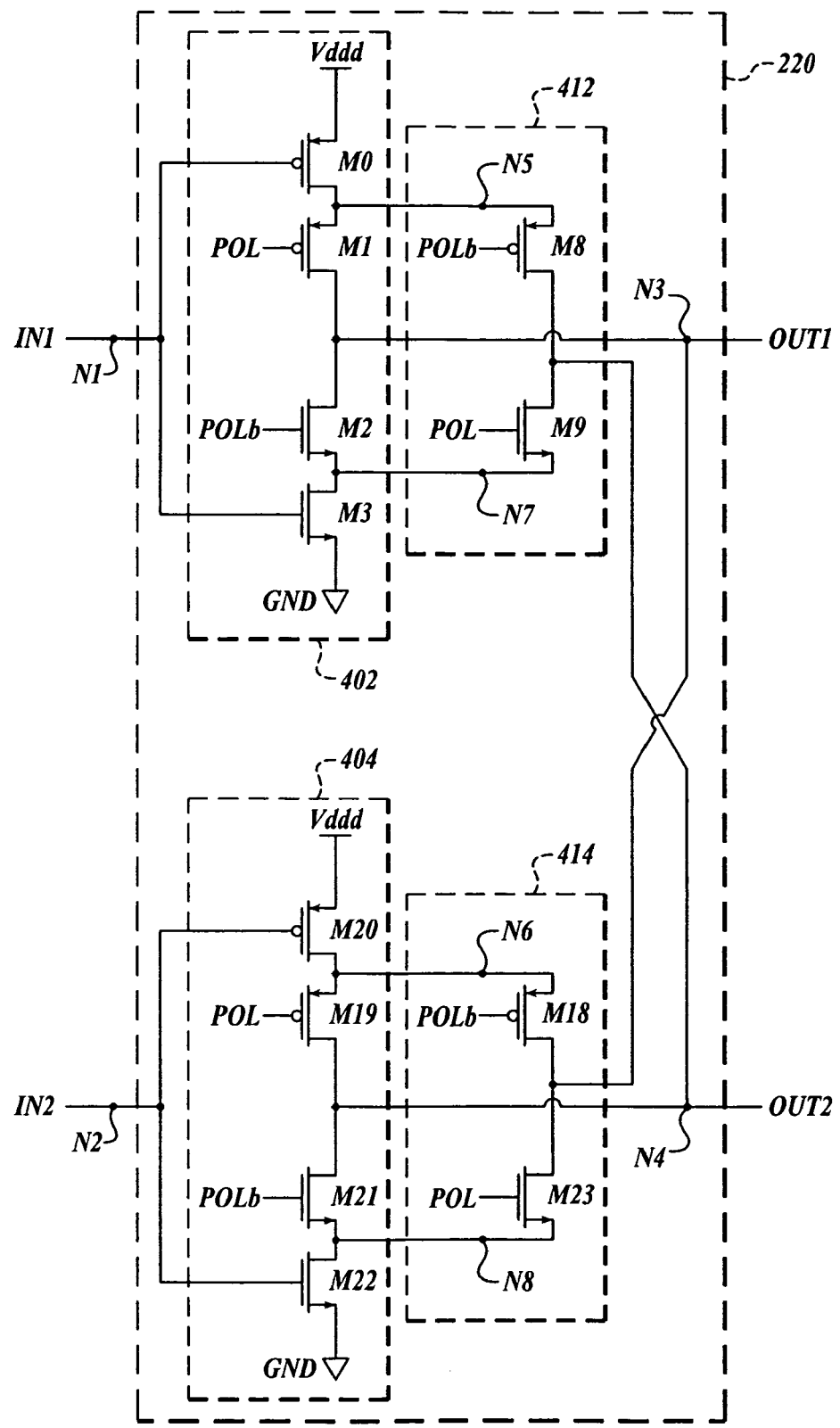
FIG. 5 shows a schematic diagram of the multiplexer circuit of FIG. 4.

FIG. 5 illustrates an exemplary embodiment of the multiplexer circuit (220) of FIG. 4. Signal pol is used as the control signal (cnt1), and signal pol$b$ is used as the complement of the control signal (cnt1$b$). The first tri-state inverter circuit (402) is implemented with transistors M0–M3. The second tri-state inverter circuit (404) is implemented with transistors M19–M22. The first switch circuit (412) is implemented with transistors M8–M9. The second switch circuit (414) is implemented with transistors M18 and M23.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A multiplexer circuit comprising:
   a first tri-state inverter circuit that is coupled to a first multiplexer input node, a first multiplexer output node, and a first switch node, wherein
   the first tri-state inverter circuit is capable of a high-impedance output at the first multiplexer output node;
   a second tri-state inverter circuit that is coupled to a second multiplexer input node, a second multiplexer output node, and a second switch node, wherein
   the second tri-state inverter circuit is capable of a high-impedance output at the second multiplexer output node;
   a first switch circuit that is coupled between the first switch node and the second multiplexer output node; and
   a second switch circuit that is coupled between the second switch node and the first multiplexer output node.

2. The multiplexer circuit of claim 1, wherein
   the first tri-state inverter circuit is configured to isolate the first multiplexer input node from the first multiplexer output node if a control signal corresponds to a second logic level.

3. The multiplexer circuit of claim 2, wherein
   the second tri-state inverter circuit is configured to isolate the second multiplexer input node from the second multiplexer output node if a control signal corresponds to the second logic level,
   the first switch circuit is configured to:
      short the first switch node to the second output node if the control signal corresponds to a second logic level, and
      isolate the first switch node from the second output node if the control signal corresponds to a first logic level, and
   the second switch circuit is configured to:

short the second switch node to the first multiplexer output node if the control signal corresponds to the second logic level, and isolate the second switch node from the first multiplexer output node if the control signal corresponds to the first logic level.

4. The multiplexer circuit of claim 2, wherein
the first tri-state inverter circuit is further configured:
to provide an inverter output signal at the first multiplexer output node in response to a first multiplexer input signal if the control signal corresponds to a first logic level, and provide the inverter output signal at the first switch node in response to the first multiplexer input signal.

5. The multiplexer circuit of claim 1, further comprising:
a third switch circuit that is coupled between the first multiplexer output node and a third switch node;
a fourth switch circuit that is coupled between the second multiplexer output node and a fourth switch node;
a high-range decoder circuit that is coupled to the third switch node; and
a low-range decoder circuit that is coupled to the fourth switch node.

6. The multiplexer circuit of claim 5, wherein the third switch circuit comprises a first transmission gate, and the fourth switch circuit comprises a second transmission gate.

7. The multiplexer circuit of claim 1, wherein:
the first tri-state inverter circuit is configured to:
receive a first multiplexer input signal at the first multiplexer input node,
receive a first control signal,
receive a complement of the first control signal,
provide a first inverter signal at the first switch node and a fifth switch node in response to the first multiplexer input signal, and
provide the first inverter signal at the first multiplexer output node in response to the first multiplexer input signal if the first control signal corresponds to a first logic level, and
the second tri-state inverter circuit is configured to:
receive a second multiplexer input signal at the second multiplexer input node,
receive the first control signal,
receive a complement of the first control signal,
provide a second inverter signal at the second switch node and a sixth switch node in response to the second multiplexer input signal, and
provide the second inverter signal at the second multiplexer output node in response to the second multiplexer input signal if the second control signal corresponds to the first logic level.

8. The multiplexer circuit of claim 7, wherein
the first switch circuit is further coupled to the fifth switch node,
the first switch circuit is configured to:
receive the first control signal and the complement of the first control signal, and
provide the first inverter signal at the second multiplexer output node if the first control signal corresponds to a second logic level,
the second switch circuit is further coupled to the sixth switch node, and
the second switch circuit is configured to:
receive the first control signal and the complement of the first control signal, and provide the second inverter signal at the first multiplexer output node if the first control signal corresponds to the second logic level.

9. The multiplexer circuit of claim 1, wherein
the multiplexer circuit consists of twelve transistors,
the first tri-state inverter circuit is configured to receive a first multiplexer input signal,
the multiplexer circuit is arranged such that the first multiplexer input signal drives at most two transistors of the twelve transistors,
the second tri-state inverter circuit is configured to receive a second multiplexer input signal, and
the multiplexer circuit is arranged such that the second multiplexer input signal drives at most another two transistors of the twelve transistors.

10. The multiplexer circuit of claim 1, wherein
the first tri-state inverter circuit comprises:
a first p-type transistor having:
a gate that is coupled to the first multiplexer input node,
a drain that is coupled to the first switch node, and
a source that is coupled to a first power supply node,
a second p-type transistor having:
a gate that is coupled to a first control node,
a drain that is coupled to the first multiplexer output node, and
a source that is coupled to the first switch node,
a first n-type transistor having:
a gate that is coupled to a second control node;
a drain that is coupled to the first multiplexer output node, and
a source that is coupled to the fifth switch node, and
a second n-type transistor having:
a gate that is coupled to the first multiplexer input node,
a drain that is coupled to a fifth switch node, and
a source that is coupled to a second power supply node, and
the first switch circuit comprises:
a third p-type transistor comprising:
a gate that is coupled to the second control node,
a drain that is coupled to the second multiplexer output node, and
a source that is coupled to the first switch node, and
a third n-type transistor comprising:
a gate that is coupled to the first control node,
a drain that is coupled to the second multiplexer output node, and
a source that is coupled to the fifth switch node.

11. The circuit of claim 1, wherein the first switch circuit is configured to substantially isolate the first switch node from the second multiplexer node if a control signal corresponds to a first level.

12. A multiplexing column driver circuit comprising:
a plurality of channels arranged in pairs, wherein a selected pair of the pairs comprises a first two-by-two multiplexer circuit, wherein the first two-by-two multiplexer circuit comprises:
a first tri-state inverter circuit that is coupled to a first multiplexer input node, a first multiplexer output node, and a first switch node;
a second tri-state inverter circuit that is coupled to a second multiplexer input node, a second multiplexer output node, and a second switch node;
a first switch circuit that is coupled between the first switch node and the second multiplexer output node; and a second switch circuit that is coupled between the second switch node and the first multiplexer output node.

13. The multiplexing column driver circuit of claim 12, wherein
one of the channels of the selected pair further comprises:
a first transmission gate that is coupled between a first channel input node and a first latch node,
a first latch circuit that is coupled between the first latch node and the first multiplexer input node,
a second transmission gate that is coupled between the first multiplexer output node and a second latch node, and
a second latch circuit that is coupled between the second latch node and a first inverter node.

14. The multiplexing column driver circuit of claim 12, wherein
the selected pair further comprises:
a high-range decoder circuit that is coupled between a first decoder node and a third multiplexer input node; and
a low-range decoder circuit that is coupled between a second decoder node and a fourth multiplexer input node.

15. The multiplexing column driver circuit of claim 14, wherein
the selected pair further comprises:
a second two-by-two multiplexer circuit that is coupled to the third multiplexer input node, the fourth multiplexer input node, a third multiplexer output node, and a fourth multiplexer output node.

16. The multiplexing column driver circuit of claim 12, wherein
the first tri-state inverter circuit is configured to isolate the first multiplexer input node from the first multiplexer output node if a control signal corresponds to a second logic level.

17. The multiplexing column driver circuit of claim 15, wherein
the second tri-state inverter circuit is configured to isolate the second multiplexer input node from the second multiplexer output node if a control signal corresponds to the second logic level,
the first switch circuit is configured to:
short the first switch node to the second output node if the control signal corresponds to the second logic level; and
isolate the first switch node from the second output node if the control signal corresponds to a first logic level; and
the second switch circuit is configured to:
short the second switch node to the first multiplexer output node if the control signal corresponds to the second logic level; and
isolate the second switch node from the first multiplexer output node if the control signal corresponds to the first logic level.

18. The multiplexing column driver circuit of claim 12, wherein
the first tri-state inverter circuit is further configured:
to provide an inverter output signal at the first multiplexer output node in response to a first multiplexer input signal if the control signal corresponds to a first logic level, and
provide the inverter output signal at the first switch node in response to the first multiplexer input signal.

19. The multiplexing column driver circuit of claim 12, wherein
the first two-by-two multiplexer circuit consists of twelve transistors;
the first tri-state inverter circuit is configured to receive a first multiplexer input signal;
the second tri-state inverter circuit is configured to receive a second multiplexer input signal; and
the first two-by-two multiplexer circuit is arranged such that
the first multiplexer input signal drives at most two transistors of the twelve transistors, and
the second multiplexer input signal drives at most another two transistors of the twelve transistors.

20. The multiplexing column driver circuit of claim 12, wherein
the first tri-state inverter circuit is configured to:
receive a first multiplexer input signal at the first multiplexer input node;
receive a first control signal;
receive a complement of the first control signal;
provide a first inverter signal at the first switch node and a fifth switch node in response to the first multiplexer input signal; and
provide the first inverter signal at the first multiplexer output node in response to the first multiplexer input signal if the first control signal corresponds to a first logic level;
the second tri-state inverter circuit is configured to:
receive a second multiplexer input signal at the second multiplexer input node;
receive the first control signal;
receive a complement of the first control signal;
provide a second inverter signal at the second switch node and a sixth switch node in response to the second multiplexer input signal; and
provide the second inverter signal at the second multiplexer output node in response to the second multiplexer input signal if the second control signal corresponds to the first logic level;
the first switch circuit is further coupled to the fifth switch node;
the first switch circuit is configured to:
receive the first control signal and the complement of the first control signal; and
provide the first inverter signal at the second multiplexer output node if the first control signal corresponds to a second logic level;
the second switch circuit is further coupled to the sixth switch node; and
the second switch circuit is configured to:
receive the first control signal and the complement of the first control signal; and
provide the second inverter signal at the first multiplexer output node if the first control signal corresponds to the second logic level.

21. A multiplexer circuit comprising:
a first means for providing a first inverted signal at a first multiplexer output node in response to a first multiplexer input signal if a control signal corresponds to a first logic level, wherein the first means for providing is capable of a high-impedance output at the first multiplexer output node;

a second means for providing a second inverted signal at a second multiplexer output node in response to a second multiplexer input signal if the control signal corresponds to the first logic level, wherein the second means for providing is capable of a high-impedance output at the second multiplexer output node; and a means for coupling the first inverted signal from a first switch node to the second multiplexer output node if the control signal corresponds to a second logic level, and for substantially isolating the first inverted signal from the second multiplexer output node if the control signal corresponds to the first logic level.

* * * * *

UNITED STATES PATENT AND TRADEMARK OFFICE
CERTIFICATE OF CORRECTION

PATENT NO. : 6,970,033 B1
DATED : November 29, 2005
INVENTOR(S) : Timothy Lance Blankenship It is certified that error appears in the above-identified patent and that said Letters Patent is hereby corrected as shown below:

Column 3,
Line 24, delete "(vgma 1-vgma 18)," and insert -- (vgma1-vgma18), --.

Column 5,
Lines 51 and 63, delete "(cnt1b)." and insert -- (cntlb). --.
Line 56, delete "(in 1)" and insert -- (in1) --.

Column 6,
Line 7, delete "(cnt1b)," and insert -- (cntlb), --.
Line 19, delete "po1b" and insert -- polb --.
Line 20, delete "(cnt1b)." and insert -- (cntlb). --.

Signed and Sealed this

Twenty-first Day of March, 2006

JON W. DUDAS
*Director of the United States Patent and Trademark Office*